United States Patent
Torti

(10) Patent No.: US 12,088,191 B1
(45) Date of Patent: Sep. 10, 2024

(54) HIGH SIDE GATE DRIVER ARCHITECTURE

(71) Applicant: Allegro MicroSystems, LLC, Manchester, NH (US)

(72) Inventor: Giuseppe Torti, Pavia (IT)

(73) Assignee: Allero MicroSystems, LLC, Manchester, NH (US)

( * ) Notice: Subject to any disclaimer, the term of this patent is extended or adjusted under 35 U.S.C. 154(b) by 3 days.

(21) Appl. No.: 18/297,034

(22) Filed: Apr. 7, 2023

(51) Int. Cl.
*H03K 17/06* (2006.01)
*H02M 1/088* (2006.01)
*H02M 3/07* (2006.01)
*H03K 17/687* (2006.01)

(52) U.S. Cl.
CPC ............. *H02M 1/088* (2013.01); *H02M 3/07* (2013.01); *H03K 17/6871* (2013.01); *H03K 2217/0063* (2013.01)

(58) Field of Classification Search
None
See application file for complete search history.

(56) References Cited

U.S. PATENT DOCUMENTS

| 6,107,860 | A | 8/2000 | Vinciarelli | |
| 6,885,225 | B2* | 4/2005 | Ohmichi | H02M 7/538 327/108 |
| 7,804,697 | B2 | 9/2010 | Melanson | |
| 8,558,586 | B1* | 10/2013 | Martin | H03K 17/6871 327/108 |
| 8,736,343 | B2 | 5/2014 | Chen et al. | |
| 9,537,383 | B1* | 1/2017 | Wibben | H02M 1/38 |
| 9,806,607 | B2* | 10/2017 | Ranmuthu | H02M 1/08 |
| 9,948,294 | B2 | 4/2018 | Peter et al. | |
| 10,367,500 | B2* | 7/2019 | Wibben | H02M 3/158 |
| 10,404,164 | B1* | 9/2019 | Stevenson | H03K 17/063 |
| 10,715,137 | B2* | 7/2020 | Chern | H02M 3/07 |
| 10,763,843 | B2* | 9/2020 | Shankar | H03K 17/063 |
| 10,979,051 | B1 | 4/2021 | Ross et al. | |
| 11,082,038 | B1 | 8/2021 | Ross et al. | |
| 11,201,619 | B2 | 12/2021 | Rinne et al. | |

(Continued)

OTHER PUBLICATIONS

Allegro MicroSystems datasheet "A81805 and A81805-1, 40 V, 2.5 A, Synchronous Buck Regulator with Low EMI and 6 μA Quiescent Current", Feb. 11, 2022, 30 pages.

*Primary Examiner* — Thomas J. Hiltunen
(74) *Attorney, Agent, or Firm* — Daly, Crowley, Mofford & Durkee, LLP

(57) ABSTRACT

A system for driving a plurality of high side NMOS power switches includes a charge pump to generate a boot voltage across a charge pump capacitor and a plurality of high side drivers. Each high side driver includes a PMOS switch to turn on the high side NMOS power switch and an NMOS switch to turn off the high side NMOS power switch. A first inverter chain coupled between the boot voltage and the input voltage generates a first control signal to control the PMOS switch and a second inverter chain coupled between an internal boot voltage and the floating switch node generates a second control signal to control the NMOS switch. The boot voltage can be equal to the input voltage plus a regulator voltage and is substantially independent of a voltage at the floating switch node and the internal boot voltage can be equal to a voltage at the floating switch node plus a regulator voltage.

19 Claims, 3 Drawing Sheets

(56) References Cited

U.S. PATENT DOCUMENTS

| | | |
|---|---|---|
| 11,211,929 B2 | 12/2021 | Rinne et al. |
| 11,228,466 B2 | 1/2022 | Petrie et al. |
| 11,251,691 B2 * | 2/2022 | Hegde .................. H02M 7/217 |
| 11,303,257 B2 | 4/2022 | Daubert et al. |
| 2014/0217959 A1 * | 8/2014 | Chen ........................ H02J 7/00 |
| | | 323/311 |
| 2021/0376822 A1 | 12/2021 | Thompson et al. |
| 2022/0116036 A1 | 4/2022 | Rinne et al. |
| 2022/0385169 A1 | 12/2022 | Ghorband et al. |

\* cited by examiner

HIGH SIDE GATE DRIVER ARCHITECTURE

BACKGROUND

Many switching circuits include a high side power switch coupled to an input voltage source and a low side power switch coupled to a reference potential, with the high side power switch coupled to the low side power switch at a switch node that is coupled to a load. The switch node voltage can experience large voltage swings between input voltage and the reference potential. Example circuits and applications of this type include motor drivers that can include a motor winding coupled to the switch node and DC/DC converters that can include an inductor coupled to the switch node.

Both the high side power switch and the low side power switch are driven by a respective driver circuit, often referred to as gate drivers. Gate drivers are often provided in the form of an integrated circuit (IC).

The high and low side power switches can take various forms, such as Field Effect Transistors (FETs) and can be Negative Metal Oxide Semiconductor (NMOS) FETs or Positive Metal Oxide Semiconductor (PMOS) FETs. NMOS power switches are often preferred for performance reasons including lower on resistance and therefore improved efficiency, smaller area requirements, and faster speed of operation and thus are often used for both the high side power switch and the low side power switch.

Use of an NMOS device as the high side power switch requires a bias voltage to the high side driver to be a floating voltage (i.e., rather than a fixed, or constant voltage), often referred to as a so-called "boot" voltage. Conventional boot voltage for this purpose needs to be a floating voltage because the high side driver needs to supply a drive voltage to the high side NMOS power switch that can range between the reference potential and a voltage greater than the input voltage, depending on the state of the high and low side NMOS power switches.

Some boot voltage sources include a charge pump that provides the boot voltage to a boot capacitor that is coupled to the switch node. The boot capacitor maintains the current necessary for the high side driver to switch the high side NMOS power switch and can be further coupled to a voltage source through a diode or a MOS switch.

Separate boot capacitors are required for each driver in systems including multiple drivers since the power switches controlled by the drivers can be in different states requiring the drivers to provide different control signal levels.

In the case of an IC implementing multiple high side driver circuits, the charge pump can be integrated, however the separate boot capacitors associated with each driver circuit are external to the IC. For example, in the case of a gate driver IC that is configured to drive six power switches of a three-phase motor, six external capacitors can be required. The use of multiple external boot capacitors can be disadvantageous due to cost and circuit area reasons.

SUMMARY

The present disclosure provides circuits and methods for driving multiple high side NMOS power switches in a manner that requires a single boot capacitor and by doing so reduces circuit area requirements and cost. These advantages are achieved by providing a boot voltage that is independent of the floating switch node voltage and generating a lower internal floating boot voltage that is equal to the switch node voltage plus a regulator voltage.

According to the disclosure, a system for driving a plurality of high side NMOS power switches, each coupled between an input voltage and a floating switch node, includes a charge pump configured to generate a boot voltage across a charge pump capacitor and a plurality of high side drivers, each configured to generate a power control signal to control a respective high side NMOS power switch. Each high side driver includes a PMOS switch to turn on the high side NMOS power switch, an NMOS switch to turn off the high side NMOS power switch, wherein the PMOS switch and the NMOS switch are coupled together at a control node at which the power control signal is provided, a first inverter chain coupled between the boot voltage and the input voltage and configured to generate a first control signal to control the PMOS switch, a circuit configured to generate an internal boot voltage, and a second inverter chain coupled between the internal boot voltage and the floating switch node and configured to generate a second control signal to control the NMOS switch.

Features may include one or more of the following individually or in combination with other features. The boot voltage can be equal to the input voltage plus a regulator voltage and is substantially independent of a voltage at the floating switch node. The system can include an integrated circuit on which the charge pump and the plurality of high side drivers are integrated and the plurality of high side NMOS power switches and the charge pump capacitor can be external to the integrated circuit. The internal boot voltage can be equal to a voltage at the floating switch node plus a regulator voltage. The circuit configured to generate an internal boot voltage can include an MOS device and a capacitor. The MOS device and the capacitor can be internal to the integrated circuit. Each of the plurality of high side drivers can further include a first translator responsive to a PWM signal and configured to generate an output signal for coupling to the first inverter chain and a second translator responsive to a complementary version of the PWM signal and configured to generate a second output signal for coupling to the second inverter chain. The plurality of high side NMOS power switches can be switches of a motor driver or switches of a DC/DC converter.

Also described is a driver circuit for driving a high side NMOS power switch coupled between an input voltage and a floating switch node and for generating a power control signal to control the high side NMOS power switch. The driver circuit includes a PMOS switch to turn on the high side NMOS power switch, an NMOS switch to turn off the high side NMOS power switch, wherein the PMOS switch and the NMOS switch are coupled together at a control node at which the power control signal is provided, a first inverter chain coupled between a boot voltage and the input voltage and configured to generate a first control signal to control the PMOS switch, a circuit configured to generate an internal boot voltage, and a second inverter chain coupled between the internal boot voltage and the floating switch node and configured to generate a second control signal to control the NMOS switch.

Features may include one or more of the following individually or in combination with other features. The boot voltage can be equal to the input voltage plus a regulator voltage and is substantially independent of a voltage at the floating switch node. The driver circuit can be an integrated circuit and the high side NMOS power switch can be external to the integrated circuit. The internal boot voltage can be equal to a voltage at the floating switch node plus a regulator voltage. The circuit configured to generate an internal boot voltage can include a MOS device and a capacitor. The MOS device and the capacitor can be internal to the integrated circuit. The driver circuit can include a first translator responsive to a PWM signal and configured to generate an output signal for coupling to the first inverter chain and a second translator responsive to a complementary version of the PWM signal and configured to generate a second output signal for coupling to the second inverter chain.

Also described is a method for driving a plurality of high side NMOS power switches, each coupled between an input voltage and a floating switch node, the method including generating a boot voltage that is substantially independent of a voltage at the floating switch node and generating with a driver circuit a power control signal to control a respective high side NMOS power switch using a PMOS switch to turn on the high side NMOS power switch and an NMOS switch to turn off the high side NMOS power switch, wherein the PMOS switch and the NMOS switch are coupled together at a control node at which the power control signal is provided.

Features may include one or more of the following individually or in combination with other features. The method may further include generating an internal boot voltage equal to the voltage at the floating switch node plus a regulator voltage. The PMOS switch can be controlled by a first inverter chain coupled between the boot voltage and the input voltage and the NMOS switch can be controlled by second inverter chain coupled between the internal boot voltage and the floating switch node. Generating the boot voltage can include using a charge pump configured to generate the boot voltage across a charge pump capacitor.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
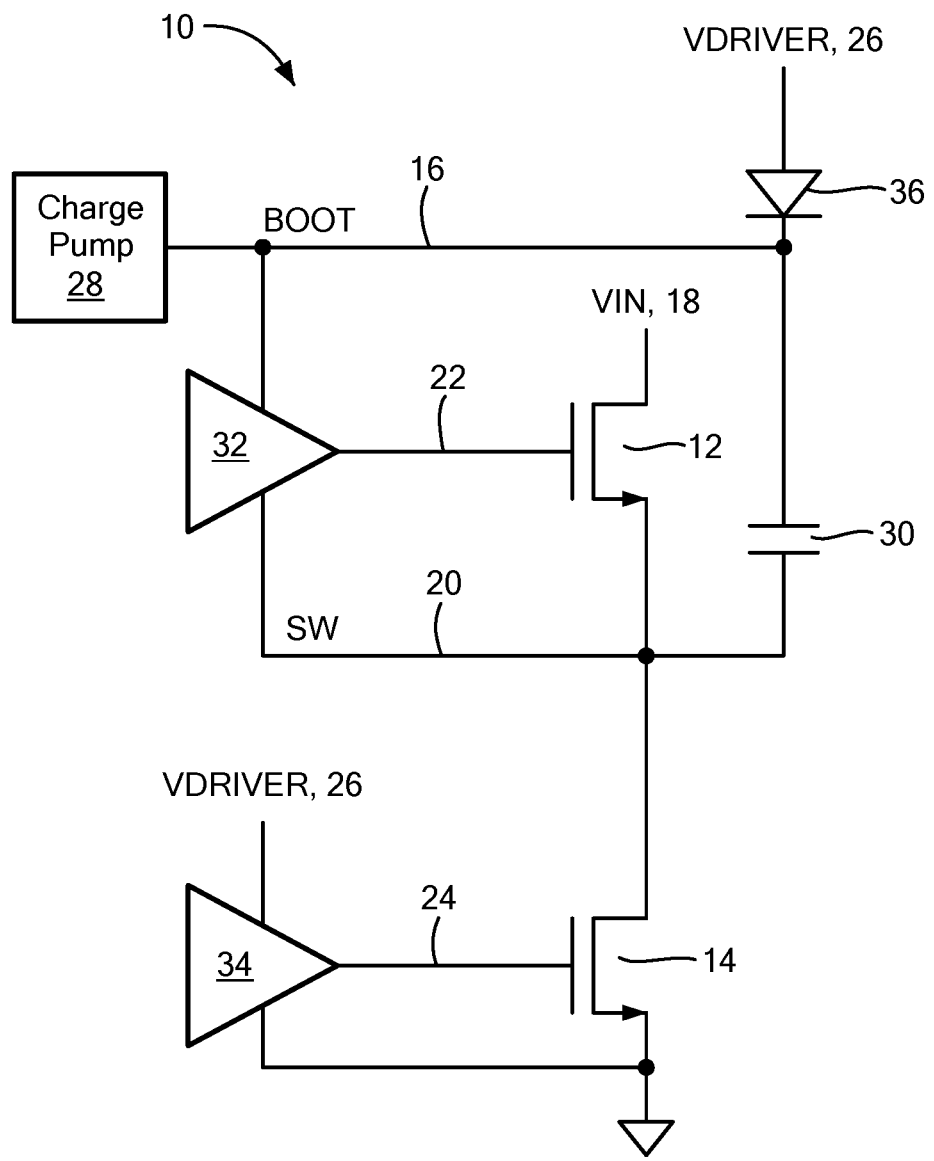
FIG. 1 shows a conventional gate driver configuration.

Referring to FIG. 1, NMOS power switches 12, 14 are coupled together at a switch node SW 20, with the high side power switch 12 having a drain terminal coupled to an input voltage source VIN 18 and a source terminal coupled to the switch node 20 and the low side power switch 14 having a drain terminal coupled to the switch node 20 and a source terminal coupled to ground. Each NMOS power switch 12, 14 has a control, or gate terminal coupled to receive a respective control signal 22, 24 from a respective driver circuit 32, 34, as shown. The high side driver circuit 32 is coupled between a floating BOOT voltage 16 and the switch node 20. The low side driver circuit 34 is coupled between a VDRIVER voltage 26 and ground. In an example application, the VIN voltage 18 can be on the order of 12-14 volts. The VDRIVER voltage 26 can be a relatively low voltage provided by a regulator, such as a nominal 3.3 volts.

The switch node 20 can be coupled to a load (not shown) based on the particular application. For example, the switch node 20 can be coupled to a motor winding or an inductor.

In operation, the switch control signals 22, 24 are complementary in the sense that when high side switch 12 is on (i.e., when the control signal 22 is high), low side switch 14 is off (i.e., the control signal 24 is low) and visa versa. Thus, the voltage at the switch node 20 can be close to the level of the input voltage VIN 18 when high side switch 12 is on and low side switch 14 is off and the voltage at the switch node 20 can be at a level near ground when the high side switch 12 is off and the low side switch 14 is on. Thus, the voltage at the switch node SW 20 can have a relatively large voltage swing (e.g., substantially a square wave) and in this sense can be described as a floating voltage.

In order to turn on the low side switch 14, the control signal 24 generated by the low side driver 34 has to exceed ground by only approximately 1 volt. However, in order to turn on the high side switch 12, the control signal 22 generated by the high side driver 32 has to exceed the voltage at the floating switch node 20 by a threshold voltage level, such as a threshold voltage of approximately 1 volt. Powering the high side driver 32 with a bias voltage sufficient to generate such a control signal 22 for the high side switch 12 (i.e., a bias voltage that can range between ground and a voltage greater than the input voltage 18 depending on the state of the high and low side NMOS power switches 12, 14) can be accomplished with BOOT voltage 16.

The conventional BOOT voltage 16 can be generated by a charge pump 28 that provides the bias voltage 16 as a floating voltage that is referenced to the floating switch node 20. The BOOT voltage 16 can be coupled to a boot capacitor 30 that sustains the necessary bias current to control the high side switch 12.

The VDRIVER voltage 26 can be coupled to charge the boot capacitor 30 through a diode 36. In other configurations, the diode 36 is replaced by a MOS switch (not shown) in order to avoid losing the forward voltage drop of the diode 36. In such configurations including a MOS switch, such switch is turned on to charge the capacitor 30 when the low side switch 14 is off.

When the low side switch 14 is on, the capacitor 30 is charged to a voltage between VDRIVER 26 minus the forward diode drop of the diode 36. When the low side switch 14 turns off and the high side switch 12 turns on, the voltage at the switch node 20 rises. The capacitor 30 maintains its voltage (i.e., a voltage of VDRIVER 26 minus the forward diode drop of the diode 36) since the diode 36 is reverse biased. Thus, this voltage of VDRIVER 26 minus the forward diode drop of the diode 36 "floats" on a voltage level between approximately ground and VDRIVER 26. Thus, the BOOT voltage 16 floats between VDRIVER 26 minus the forward diode drop and VIN 18 plus VDRIVER 26 minus the forward voltage drop. The BOOT voltage 16 minus the switch voltage 20 is always equal to VDRIVER 26 minus the forward diode drop.

In order to satisfactorily bias the high side driver 32, the boot capacitor 30 can be on the order of 10 nF-100 nF. In the case of an IC implementing multiple high side driver circuits (that can be the same as or similar to high side driver 32), the charge pump 28 can be integrated, however the boot capacitors associated with each driver circuit (that can be the same as or similar to capacitor 30) are external to the IC. For example, in the case of a gate driver IC that is configured to drive six power switches of a three-phase motor, six external capacitors are required. The use of multiple external boot capacitors can be disadvantageous at least for cost and circuit area reasons.

Figure 2:
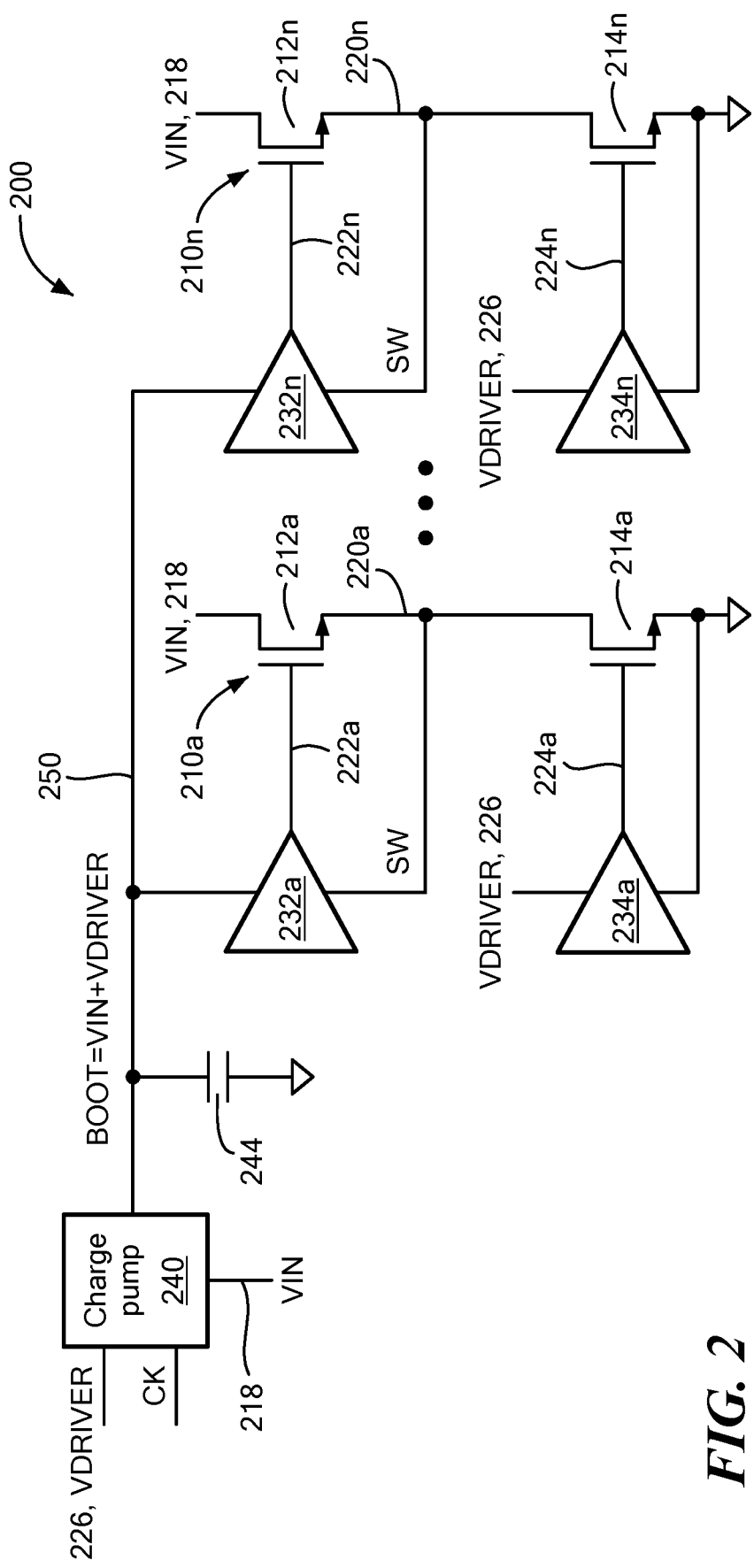
FIG. 2 is a block diagram of a system including a plurality of gate drivers according to the disclosure.

Referring to FIG. 2, a system 200 includes a plurality of gate drivers for driving a plurality of NMOS power switches according to the disclosure. The system 200 can include "n" strings or branches 210a-210n, each including a high side NMOS power switch 212a-212n and a series-coupled low side NMOS power switch 214a-214n. It will be appreciated that the number "n" of power switch branches 210a-210n can be two or more, depending on the application. In an example application, the system is a motor control system.

More particularly, each power switch branch 210a-210n includes a high side NMOS power switch 212a-212n coupled to a low side NMOS power switch 214a-214n at a switch node switch node 220a-220n, respectively, as shown. Each high side power switch 212a-212n has a drain terminal coupled to an input voltage source VIN 218 and a source terminal coupled to the respective switch node 220a-220n and each low side power switch 214a-214n has a drain terminal coupled to the respective switch node 220a-220n and a source terminal coupled to ground.

Each high side NMOS power switch 212a-212n has a control, or gate terminal coupled to receive a control signal 222a-222n from a high side driver circuit 232a-232n, respectively, as shown. Each low side NMOS power switch 214a-214n has a control, or gate terminal coupled to receive a control signal 224a-224n from a low side driver circuit 234a-234n, respectively, as shown.

According to the disclosure, the high side driver circuits 232a-232n are coupled between a non-floating (i.e., substantially fixed) boot voltage 250 and the respective switch node 220a-220n. The non-floating boot voltage 250 is in contrast to a conventional boot voltage (e.g., boot voltage 16 of FIG. 1) that floats with the switch node voltage as explained above. Stated differently, the non-floating boot voltage 250 is substantially constant and is independent of the voltage at the switch node.

The low side driver circuits 234a-234n are coupled between a VDRIVER voltage 226 and ground.

In an example application, the VIN voltage 218 can be on the order of 12-14 volts. It will be appreciated by those of ordinary skill in the art however that the VIN voltage 218 can be higher or lower than this example. VDRIVER voltage 26 can be a relatively low voltage provided by a regulator, such as a nominal 3.3 volts.

The switch nodes 220a-220n can be coupled to a load (not shown) based on the particular application. For example, switch nodes 220a-220n can be coupled to motor windings.

In operation, the high side switch control signals 222a-222n are complementary with respect to the low side switch control signals 224a-224n in the sense that, in any given power switch branch 210a-210n, when high side switch 212a-212n is on, the series-coupled low side switch 214a-214n is off and visa versa. Thus, the voltage at the switch nodes 220a-220n can be between a voltage level close to the level of the input voltage VIN 218 when the respective high side switch 212a-212n is on and the respective low side switch 214a-214n is off and ground when the respective high side switch 212a-212n is off and the respective low side switch 214a-214n is on. In some applications, based on the level and range of the input voltage VIN 218, the voltage at the switch nodes 220a-220n has a relatively large voltage swing and in this sense can be described as a floating voltage.

In order to turn on the low side switches 214a-214n, the control signals 224a-224n have to exceed ground by only approximately 1 volt. However, in order to turn on the high side switches 212a-212n, the control signals 222a-222n have to exceed the voltage at the floating switch node 220a-220n by approximately a threshold voltage, such as by a threshold voltage of approximately 1 volt.

According to the disclosure, powering the high side drivers 232a-232n with a bias voltage sufficient to generate such control signals 222a-222n for the high side switches 212a-212n (i.e., a bias voltage that can range between ground and a voltage greater than the input voltage 218 depending on the state of the high and low side NMOS power switches) can be accomplished with a non-floating boot voltage 250.

The non-floating boot voltage 250 can be generated by a charge pump 240. The charge pump 240 can be coupled to receive the VDRIVER voltage 226, the input voltage VIN 218, and a clock signal CK for use with the charge pump.

The resulting non-floating boot voltage 250 can be equal to the input voltage 218 plus the VDRIVER regulated voltage 226. Thus, in the example embodiment, the non-floating boot voltage 250 can have a substantially constant value on the order of 15.3 volts (for an input voltage 218 of 12 volts and a VDRIVER voltage 226 of 3.3 volts) that is independent of the switch node voltage and also independent of the level of the input voltage. More generally however, the non-floating boot voltage 250 can have a value of VIN+VDRIVER.

Because the boot voltage 250 is non-floating (i.e., is independent of a voltage at the floating switch node), a single boot capacitor 244 can be used to bias the plurality of high side drivers 232a-232n. This arrangement is in contrast to conventional systems in which a separate boot capacitor is required for each high side driver, as explained in connection with FIG. 1 above and thus, has cost and circuit area advantages accordingly. Boot capacitor 244 can have a value on the order of 10-100 nF.

Use of the non-floating boot voltage 250 to bias multiple high side drivers 232a-232n requiring only a single capacitor 244 is possible due to the architecture of the high side drivers 232a-232n, as explained in connection with an example high side driver 300 in connection with FIG. 3. Since the non-floating boot voltage 250 can be used to supply all of the high side drivers 232a-232n, it will be appreciated that this configuration avoids the need for n−1 additional capacitors.

In an example implementation, the driver circuits 232a-232n, 234a-234n are provided in the form of an IC. In such IC implementations, the charge pump 240 can also be integrated. The capacitor 244 can be external to the IC, but since a single capacitor 244 is required, a space and cost savings is achieved as compared to use of a conventional floating boot voltage (e.g., voltage 16 in FIG. 1). It will be appreciated by those of ordinary skill in the art that the power switches 212a-212n, 214a-214n can be internal or external.

Figure 3:
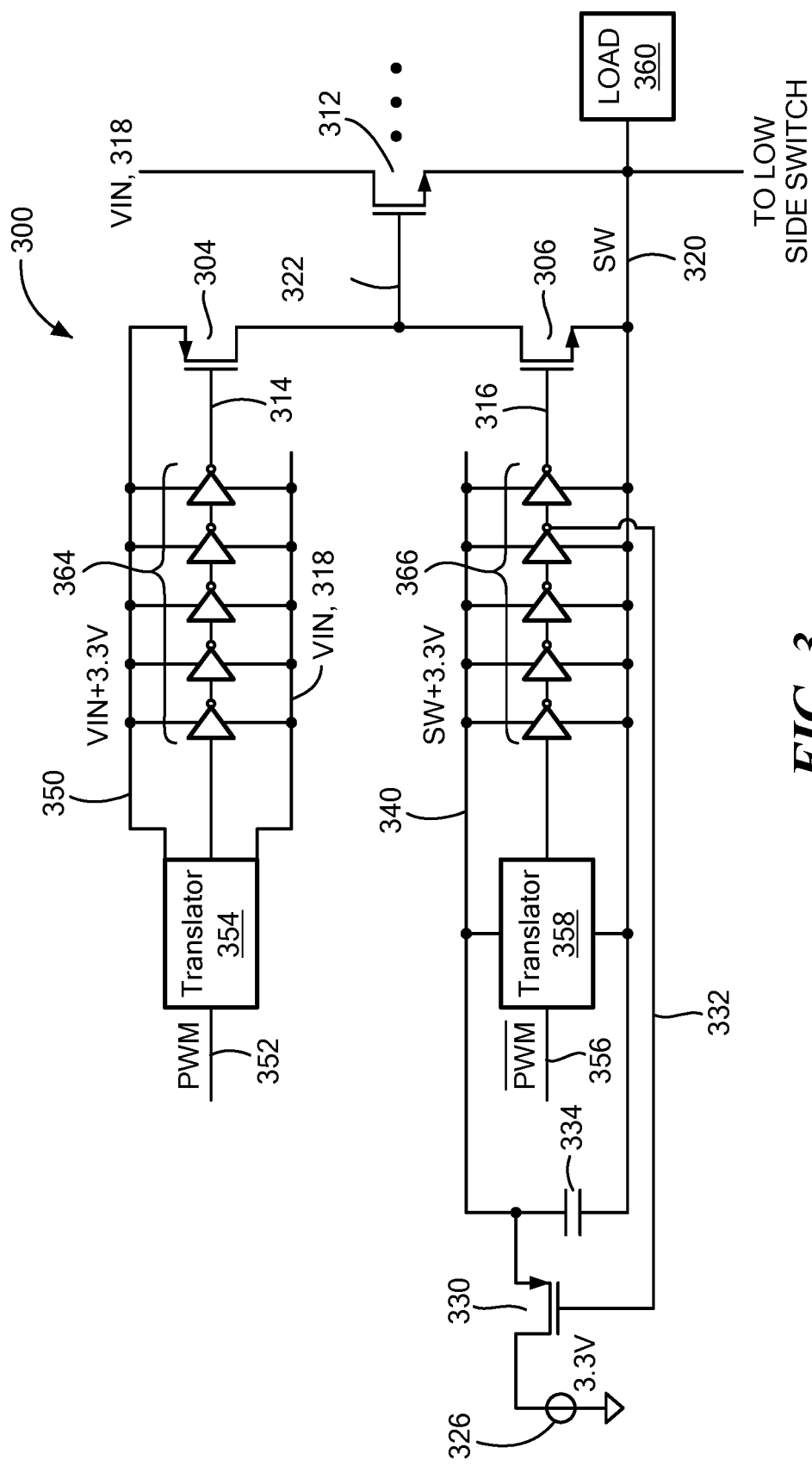
FIG. 3 is a block diagram of a high side driver of the system of FIG. 2 according to the disclosure.

Referring to FIG. 3, a high side driver circuit 300 according to the disclosure, and as may be the same as or similar to any of the high side driver circuits 232a-232n of FIG. 2, is shown. For example, high side driver 300 can provide high side driver 232a, in which case the high side NMOS power switch 312 provides the high side NMOS power switch 212a of FIG. 2. Thus, the NMOS power switch 312 has a drain terminal coupled to an input voltage VIN 318 that can be the same as or similar to input voltage 218 and a source terminal coupled to a low side NMOS power switch that can be the same as or similar to switch 214a at a floating switch node SW 320 that can be the same as or similar to switch node 220a and thus, that can be configured to couple to a load 360. A gate or control terminal of the high side NMOS power switch 312 is coupled to receive a control signal 322 from the high side driver 300. Additional strings including high side switches that are series-coupled to low side switches (not shown but depicted by dots next to high side switch 312) can be coupled to power loads that form part of a common load with load 360. For example, in the case of a three-phase motor driver, load 360 can represent a single motor winding and two additional motor windings can be powered by two respective switch strings.

High side driver 300 includes a PMOS switch 304 coupled to an NMOS switch 306 at a control node at which the control signal 322 is generated. The PMOS switch 304 is configured to turn on the high side NMOS power switch 312 and the NMOS switch 306 is configured to turn off the high side NMOS power switch 312.

The PMOS switch 304 is driven by a control signal 314 that is generated by an inverter chain 364 coupled between a non-floating boot voltage 350 (that can be the same as or similar to the non-floating boot voltage 250 of FIG. 2) and the VIN voltage 318. In other words, non-floating boot voltage 350 can be generated by a charge pump with a single capacitor (e.g., like capacitor 244 of FIG. 2) that biases additional high side driver circuits in addition to circuit 300. Thus, non-floating boot voltage 350 can be equal to VIN+ VDRIVER, where VDRIVER is a relatively low-level regulated voltage such as 3.3 volts as may be generated by an integrated regulator 326.

A translator 354 can operate as a level shifter to convert a relatively low voltage Pulse Width Modulation (PWM) signal 352 having a level that can be between ground and approximately 3.3 volts to a level for the control signal 314 that has a voltage equal to VIN+3.3 volts. The PWM signal 352 can be generated by circuitry (not shown) and can be user controlled in order to control conduction of the high side switch 312, the series-coupled low side switch, and other switches in other switch strings (not shown) in order to power load 360.

The inverter chain 364 can include a plurality of inverters having sizes designed to increase the power of the PWM signal 352 to a level suitable to turn on and off PMOS switch 304. For example, the second inverter in the string 364 can have a power level that is twice the power level of the first inverter, the third inverter in the string 364 can have a power level that is three times the power level of the first inverter, and so on.

The NMOS switch 306 is driven by a control signal 316 that is generated by an inverter chain 366 coupled between a floating boot voltage 340 and the floating switch node 320. The floating boot voltage 340 can be generated by the regulator 326 in combination with a PMOS switch 330 and a boot capacitor 334. The floating boot voltage 340 can be equal to a voltage at the floating switch node 320 plus a regulator voltage 326.

The floating boot voltage 340 can be generated "on-chip" in configurations in which the driver circuit 300 is implemented in the form of an integrated circuit. In other words, the regulator 326, the PMOS switch 330, and the boot capacitor 334 can be integrated as is desirable. Thus, the floating boot voltage 340 can be referred to as an internal boot voltage.

A translator 358 can operate as a level shifter to convert a complementary version 356 of the PWM signal 352 having a level that can be between ground and approximately 3.3 volts to a level for the control signal 316 that has a voltage equal to the switch node voltage 320 plus 3.3 volts. The complementary PWM signal 356 can be generated by circuitry (not shown) and can be user controlled in order to control conduction of the high side switch 312, the series-coupled low side switch, and other switches in other switch strings (not shown) in order to power load 360.

The inverter chain 366 can include a plurality of inverters having sizes designed to increase the power of the complementary PWM signal 356 to a level suitable to turn on and off NMOS switch 306. For example, the second inverter in the string 366 can have a power level that is twice the power level of the first inverter, the third inverter in the string 366 can have a power level that is three times the power level of the first inverter, and so on.

In operation, when the PMOS switch 304 is turned on, the control signal 322 goes to a voltage high enough to turn on the high side NMOS power switch 312 and when the NMOS switch 306 is turned on, the control signal 322 goes low enough to turn off the NMOS power switch 312. The PMOS switch 330 that generates the internal boot voltage 340 is on when the high side NMOS power switch 312 is on (i.e., when the PMOS switch 304 is on and the NMOS switch 306 is off) and the PMOS switch 330 is off when the high side NMOS power switch is off (i.e., when the NMOS switch 306 is on).

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A system for driving a plurality of high side NMOS power switches, each coupled between an input voltage and a floating switch node, comprising:
    a charge pump configured to generate a boot voltage across a charge pump capacitor; and
    a plurality of high side drivers, each configured to generate a power control signal to control a respective high side NMOS power switch and comprising:
        a PMOS switch to turn on the high side NMOS power switch;
        an NMOS switch to turn off the high side NMOS power switch, wherein the PMOS switch and the NMOS switch are coupled together at a control node at which the power control signal is provided;
        a first inverter chain coupled between the boot voltage and the input voltage and configured to generate a first control signal to control the PMOS switch;
        a circuit configured to generate an internal boot voltage; and
        a second inverter chain coupled between the internal boot voltage and the floating switch node and configured to generate a second control signal to control the NMOS switch.

2. The system of claim 1, wherein the boot voltage is equal to the input voltage plus a regulator voltage and is substantially independent of a voltage at the floating switch node.

3. The system of claim 1, wherein the system comprises an integrated circuit on which the charge pump and the plurality of high side drivers are integrated and wherein the plurality of high side NMOS power switches and the charge pump capacitor are external to the integrated circuit.

4. The system of claim 1, wherein the internal boot voltage is equal to a voltage at the floating switch node plus a regulator voltage.

5. The system of claim 1, wherein the circuit configured to generate an internal boot voltage comprises a MOS device and a capacitor.

6. The system of claim 5, wherein the MOS device and the capacitor are internal to the integrated circuit.

7. The system of claim 1, wherein each of the plurality of high side drivers further comprises a first translator responsive to a PWM signal and configured to generate an output signal for coupling to the first inverter chain and a second translator responsive to a complementary version of the PWM signal and configured to generate a second output signal for coupling to the second inverter chain.

8. The system of claim 1, wherein the plurality of high side NMOS power switches comprise switches of a motor driver.

9. The system of claim 1, wherein the plurality of high side NMOS power switches comprise switches of a DC/DC converter.

10. A driver circuit for driving a high side NMOS power switch coupled between an input voltage and a floating switch node and for generating a power control signal to control the high side NMOS power switch, comprising:
   a PMOS switch to turn on the high side NMOS power switch;
   an NMOS switch to turn off the high side NMOS power switch, wherein the PMOS switch and the NMOS switch are coupled together at a control node at which the power control signal is provided;
   a first inverter chain coupled between a boot voltage and the input voltage and configured to generate a first control signal to control the PMOS switch;
   a circuit configured to generate an internal boot voltage; and
   a second inverter chain coupled between the internal boot voltage and the floating switch node and configured to generate a second control signal to control the NMOS switch.

11. The driver circuit of claim 10, wherein the boot voltage is equal to the input voltage plus a regulator voltage and is substantially independent of a voltage at the floating switch node.

12. The driver circuit of claim 10, wherein the driver circuit is an integrated circuit and wherein the high side NMOS power switch is external to the integrated circuit.

13. The driver circuit of claim 10, wherein the internal boot voltage is equal to a voltage at the floating switch node plus a regulator voltage.

14. The driver circuit of claim 10, wherein the circuit configured to generate an internal boot voltage comprises a MOS device and a capacitor.

15. The driver circuit of claim 14, wherein the MOS device and the capacitor are internal to the integrated circuit.

16. The driver circuit of claim 10, wherein the driver circuit further comprises a first translator responsive to a PWM signal and configured to generate an output signal for coupling to the first inverter chain and a second translator responsive to a complementary version of the PWM signal and configured to generate a second output signal for coupling to the second inverter chain.

17. A method for driving a plurality of high side NMOS power switches, each coupled between an input voltage and a floating switch node, comprising:
   generating a boot voltage that is substantially independent of a voltage at the floating switch node; and
   generating with a driver circuit a power control signal to control a respective high side NMOS power switch using a PMOS switch to turn on the high side NMOS power switch and an NMOS switch to turn off the high side NMOS power switch, wherein the PMOS switch and the NMOS switch are coupled together at a control node at which the power control signal is provided, wherein the PMOS switch is controlled by a first inverter chain coupled between the boot voltage and the input voltage and wherein the NMOS switch is controlled by a second inverter chain coupled between an internal boot voltage and the floating switch node.

18. The method of claim 17, further comprising generating the internal boot voltage equal to the voltage at the floating switch node plus a regulator voltage.

19. The method of claim 17, wherein generating the boot voltage comprises using a charge pump configured to generate the boot voltage across a charge pump capacitor.

* * * * *

UNITED STATES PATENT AND TRADEMARK OFFICE
CERTIFICATE OF CORRECTION

| | | |
|---|---|---|
| PATENT NO. | : 12,088,191 B1 | Page 1 of 1 |
| APPLICATION NO. | : 18/297034 | |
| DATED | : September 10, 2024 | |
| INVENTOR(S) | : Giuseppe Torti | |

It is certified that error appears in the above-identified patent and that said Letters Patent is hereby corrected as shown below:

On the Title Page

Item (73), delete "Allero" and replace with --Allegro--.

Signed and Sealed this
Fourth Day of March, 2025

Coke Morgan Stewart
*Acting Director of the United States Patent and Trademark Office*